United States Patent
Naem

(10) Patent No.: US 6,399,455 B1
(45) Date of Patent: Jun. 4, 2002

(54) METHOD OF FABRICATING A BIPOLAR TRANSISTOR WITH ULTRA SMALL POLYSILICON EMITTER

(75) Inventor: Abdalla Aly Naem, Overijse (BE)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 09/881,904

(22) Filed: Jun. 15, 2001

(51) Int. Cl.$^7$ .............................................. H01L 21/331
(52) U.S. Cl. ...................................................... 438/369
(58) Field of Search ........................ 438/369, FOR 165

(56) References Cited

U.S. PATENT DOCUMENTS

| | | | | |
|---|---|---|---|---|
| 5,061,644 A | * | 10/1991 | Yue et al. .......... | 148/DIG. 124 |
| 5,086,016 A | * | 2/1992 | Brodsky et al. ..... | 148/DIG. 34 |
| 6,001,701 A | * | 12/1999 | Carroll et al. ....... | 148/DIG. 10 |
| 6,124,180 A | * | 9/2000 | Chambers et al. ... | 148/DIG. 10 |

OTHER PUBLICATIONS

Wim van der Wel, et al. "Poly–Ridge Emitter Transistor (PRET): Simple Low–Power Option to a Bipolar Process", IEDM 93–453, IEEE 1993.

* cited by examiner

Primary Examiner—George Fourson
(74) Attorney, Agent, or Firm—Stallman & Pollack LLP

(57) ABSTRACT

A method of fabricating a small bipolar transistor emitter in an integrated circuit structure is provided. The integrated circuit structure includes a trench isolation structure formed in a semiconductor substrate to define a substrate active device region. A collector region having a first conductivity type is formed in the substrate active device region beneath a surface thereof. A base region having a second conductivity type opposite the first conductivity type is formed in the substrate active device region above the collector region and extending to the surface of the substrate active device region such that the surface of the active device region forms a surface of the base region. A layer of dielectric material is formed to extend at least partially over the surface of the base region to define an edge of the layer of dielectric material that is formed over the surface of the base region. A layer of doped polysilicon is then formed over the surface of the layer of dielectric material and extending over the edge of the layer of dielectric material and over the surface of the base region. A chemical mechanical polishing step is then performed to planerize the layer of doped polysilicon. The layer of doped polysilicon is then patterned to define a polysilicon emitter region that extends over the edge of the layer of dielectric material to provide a polysilicon emitter contact on the surface of the base region. The polysilicon emitter region is then heated such that dopant contained in the polysilicon emitter region diffuses from the polysilicon emitter contact through the surface of the base region to define an emitter junction region at the surface of the base region beneath the polysilicon emitter contact. Dielectric sidewall spacers are then formed on the sidewalls of the polysilicon emitter region to electrically isolate the polysilicon emitter.

1 Claim, 2 Drawing Sheets

METHOD OF FABRICATING A BIPOLAR TRANSISTOR WITH ULTRA SMALL POLYSILICON EMITTER

BACKGROUND OF THE INVENTION

1. Field of the Invention

The present invention relates to the fabrication of integrated circuit structures and, in particular, to the fabrication of an ultra-small, sub-lithographic bipolar transistor emitter using conventional lithography techniques.

2. Discussion of the Related Art

A bipolar transistor is a three-terminal device that can, when properly biased, controllably vary the magnitude of the current that flows between two of the transistor's terminals. The three terminals include a base terminal, a collector terminal and an emitter terminal. The charge carriers, which form the current, flow between the collector terminal and the emitter terminal; variations in the voltage applied to the base terminal cause the magnitude of the current to vary.

Due to the increasing demand for battery-powered devices, there is a need for a bipolar transistor that utilizes less power. Lower power consumption can be obtained in a bipolar transistor by reducing the maximum current that can flow between the collector and emitter terminals. One approach for reducing the maximum current is to reduce the size of the base-to-emitter junction, preferably to sub-lithographic feature sizes.

The literature reports a method that allows the formation of polysilicon ridge emitter transistors down to 0.1 micron width without relying on advanced lithography tools. See "Poly Emitter Transistor (PRET): Simple Low Power Option to a Bipolar Process", by Wim van der Wel, et al., IEDM 93–453, 1993, pp. 17.6.1–17.6.4. However, this method utilizes two polysilicon layers, as shown in the FIGS. 1A–1C fabrication sequence.

As shown in FIG. 1A, the van der Wel et al. technique begins in the conventional manner with an integrated circuit structure that includes a trench isolation structure 100 formed in a semiconductor substrate to define a substrate active device region 102. An n-type collector region 104 is formed in the substrate active device region 102 and a p-type base region 106 is formed above the collector region 104. A layer of silicon dioxide 108 is formed to extend over the active device region 102. A first layer of n-doped polysilicon is then formed over the layer of dielectric material 108. The polysilicon layer and the underlying silicon dioxide 108 are then patterned to define a poly1 emitter region 110 that extends over the p-type base region 106 but is separated from the base region 106 by intervening dielectric material 108. A second layer of n-doped polysilicon is then formed over the above-described structure, as further shown in FIG. 1A.

As shown in FIG. 1B, the poly2 layer is then anisotropically etched to define poly2 sidewalls 112 on the poly1 emitter region 110. An subsequent annealing step results in diffusion of n-type dopant from the poly2 sidewall formed on the base region 106 into the p-type base region 106 to define an n-type emitter junction 114 in the base region 106. Dielectric sidewalls 116 are then formed to electrically isolate the poly2 sidewalls. Finally, salicide films 118 are formed on the base region 106 and on the poly1 emitter region 110, as shown in FIG. 1C.

Although the van der Wel technique described above results in small emitters, it has the following disadvantages. First, the slope of the poly1 emitter region is critical to success of this method; the slope could affect the width of the emitter (i.e. the poly2 sidewalls) significantly, introduce large variability in the emitter width across the wafer and, therefore, result in performance variability. Second, the possible large variability of the poly emitter ridge, i.e. the poly 2, could in turn introduce large variability in the oxide spacers, which could cause shorts between the emitter and the base regions during the salicidation step. Third, emitter n-type dopant diffusion is less in the structure, compared to conventional single poly device architectures, due to the possible presence of a poly1/poly2 interfacial barrier in the emitter structure, as shown in FIG. 1C.

Thus, there is a need for a low-power bipolar transistor with a sub-lithographic base-to-emitter junction that reduces, or preferably eliminates, the previously-described drawbacks.

SUMMARY OF THE INVENTION

The present invention provides a bipolar transistor structure with an ultra-small polysilicon emitter and a method of fabricating the structure. The bipolar transistor structure includes trench isolation formed in a semiconductor substrate to define a substrate active device region. A collector region having a first conductivity type is formed conventionally beneath the surface of the substrate active device region. A base region having a second conductivity type opposite the first conductivity type is formed conventionally in the substrate active device region above the collector region and extending to the surface of the substrate active device region. A layer of dielectric material is formed to extend at least partially over the surface of the base region. A layer of polysilicon, doped to the first conductivity type, is then formed over the surface of the layer of dielectric material and extending over the edge of the layer of dielectric material and over the surface of the base region. A chemical mechanical polishing step is then performed to planarize the layer of doped polysilicon. The layer of doped polysilicon is then patterned to define a polysilicon emitter region that extends over the edge of the layer of dielectric material to provide an ultra-small, sub 0.2 micron, polysilicon emitter contact on the surface of the base region. The polysilicon emitter region is then heated such that dopant diffuses from the polysilicon emitter contact through the surface of the base region to form an emitter junction region having the first conductivity type at the surface of the base region beneath the polysilicon emitter contact. Dielectric sidewall spacers are then formed on the sidewalls of the polysilicon emitter region to electrically isolate the polysilicon emitter sidewalls.

A better understanding of the features and advantages of the present invention will be obtained by reference to the following detailed description and accompanying drawings that set forth an illustrative embodiment in which the principles of the invention are utilized.

DETAILED DESCRIPTION OF THE INVENTION

Figure 1A:
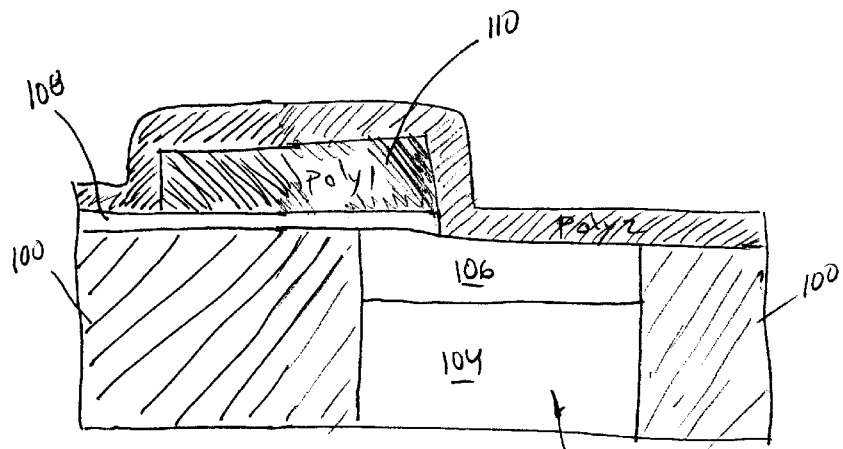
FIGS. 1A–1C are partial cross section views illustrating a sequence of steps for fabricating a poly-ridge emitter transistor in accordance with published techniques.
Figure 1B:
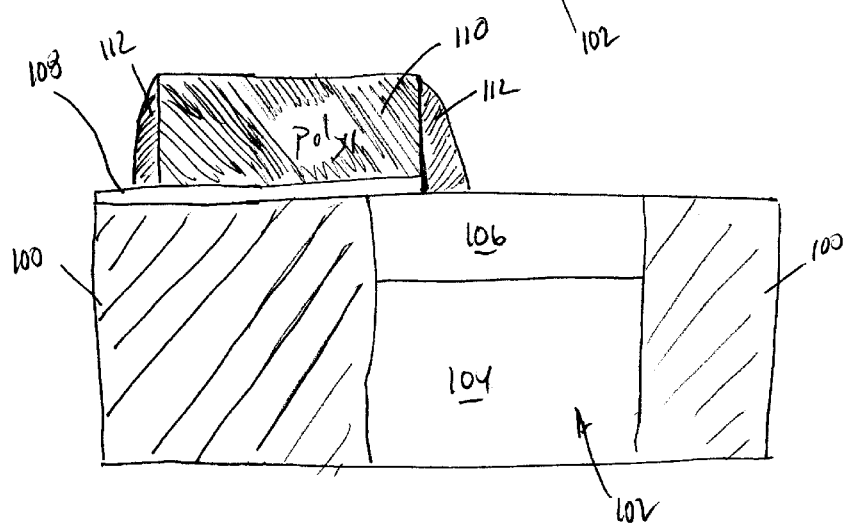
Figure 1C:
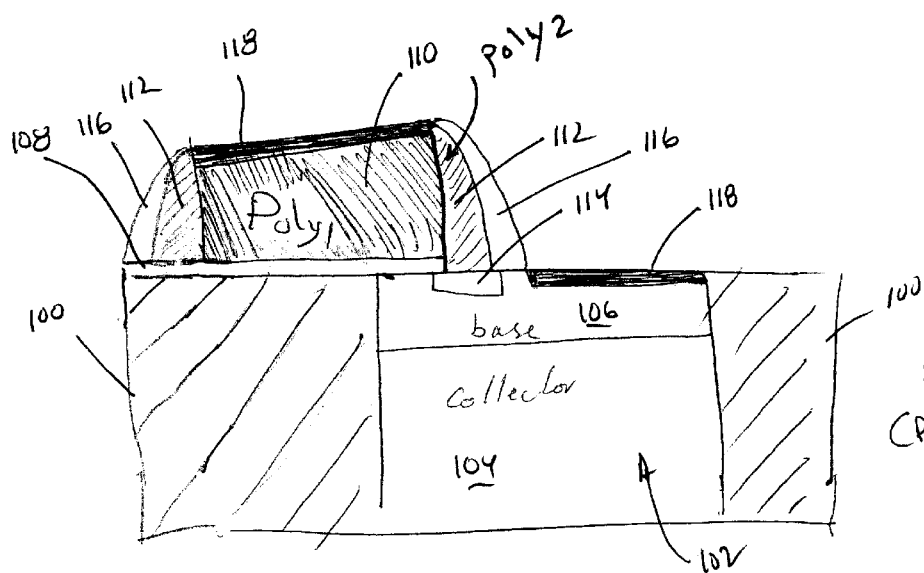
Figure 2A:
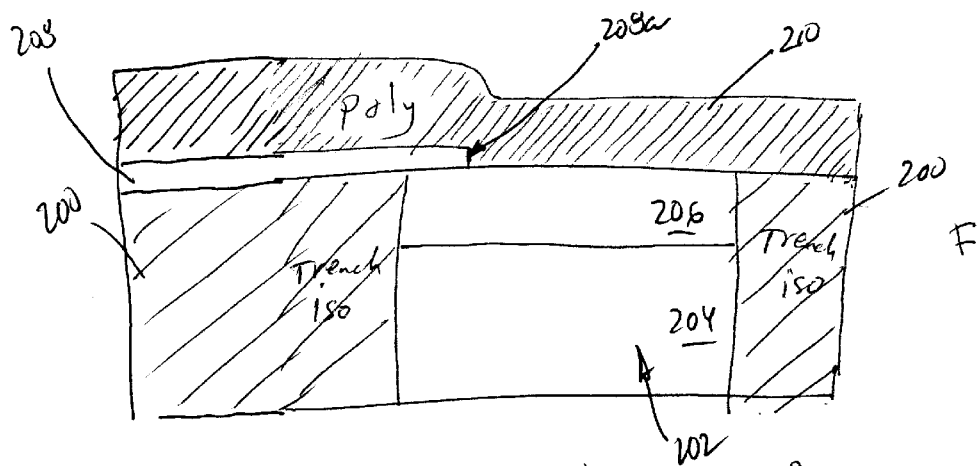
FIGS. 2A–2D are partial cross section views illustrating a sequence of steps for fabricating an ultra-small bipolar transistor emitter in accordance with the concepts of the present invention.

FIG. 2A shows a partially completed low-power bipolar transistor structure. The bipolar transistor structure is formed on a semiconductor wafer, typically silicon, that has an n+buried layer and a lightly-doped, n-type epitaxial layer that is formed over the n+ buried layer, the n+ buried layer and the n-type epitaxial layer forming the collector 204 of the bipolar transistor, all in accordance with conventional techniques. A p-type intrinsic base region 206 is formed above the collector region 204, also in accordance with conventional techniques.

As shown in FIG. 2A, the bipolar transistor structure includes trench isolation regions 200 formed in the semiconductor substrate to define a substrate active device region 202 that includes n-type collector region 204 and p-type base region 206. A layer of dielectric material 208, preferably silicon dioxide about 1000 Angstroms thick, is formed and patterned to extend partially over the surface of the base region 206 to define an edge 208a of the layer of dielectric material 208 that is formed over the surface of the intrinsic base region 206.

Figure 2B:
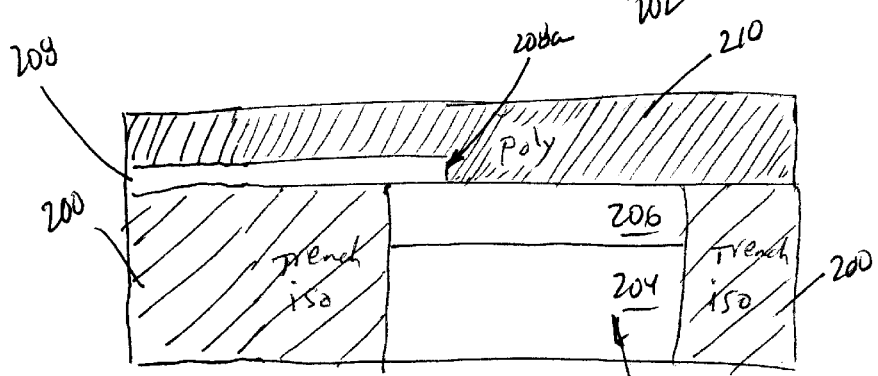

A layer of polysilicon 210, about 2000 Angstroms thick, is then formed over a surface of the layer of dielectric material 208 and extending over the edge 210a of the layer of dielectric material 208 and over the surface of the base region 206, as shown in FIG. 2A. Polysilicon layer 210 is conventionally doped with phosphorous or arsenic, e.g. by ion implantation, to have a high n+ dopant concentration Referring to FIG. 2B, in accordance with the concepts of the invention, a chemical mechanical polishing (CMP) step is then performed to planarize the layer of n-doped polysilicon 210.

Figure 2C:
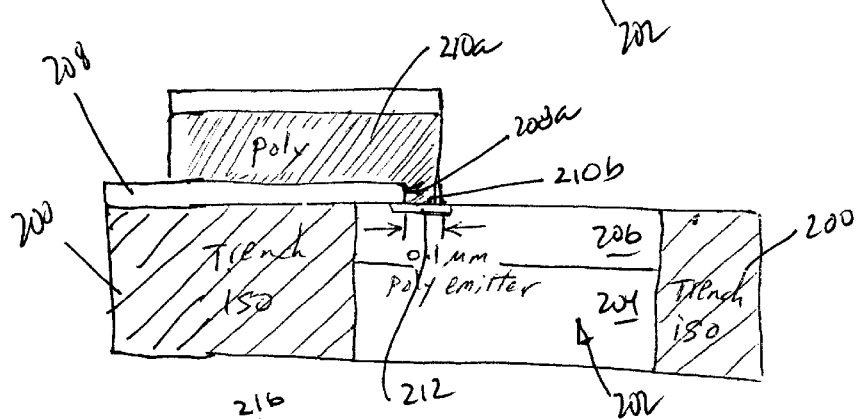

Referring to FIG. 2C, the layer of n-doped polysilicon 210 is then masked and patterned, using conventional photolithographic techniques, to define a polysilicon emitter region 210a that extends over the edge 208a of the layer of dielectric material 208 to provide a polysilicon emitter contact 210b on the surface of the base region 206. The structure is then heated such that n-type dopant contained in the polysilicon emitter region 210a diffuses through the surface of the p-type intrinsic base region 206 to define an n-type emitter junction region 212 at the surface of the base region 206 beneath the polysilicon emitter contact 210b, as shown in FIG. 2C.

Figure 2D:
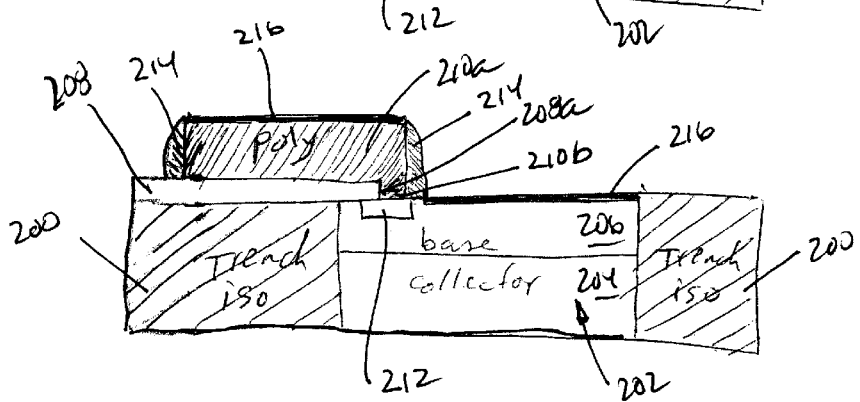
Figure 1A:
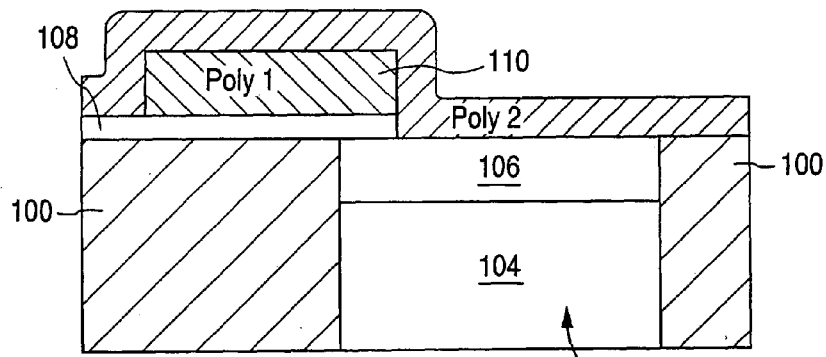
Figure 1B:
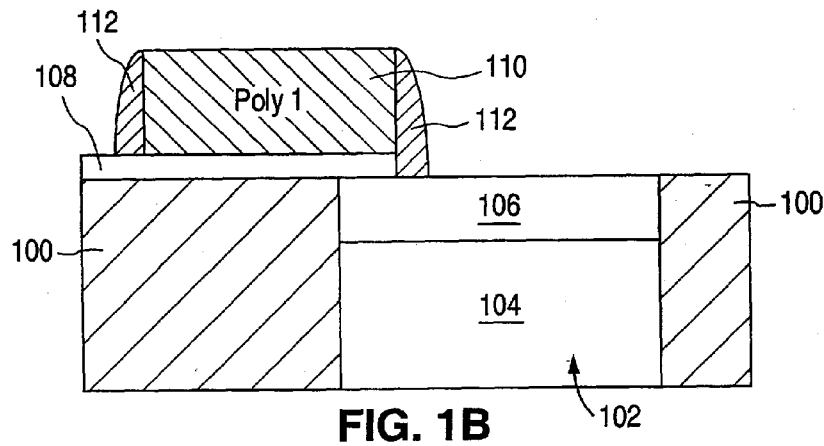
Figure 1C:
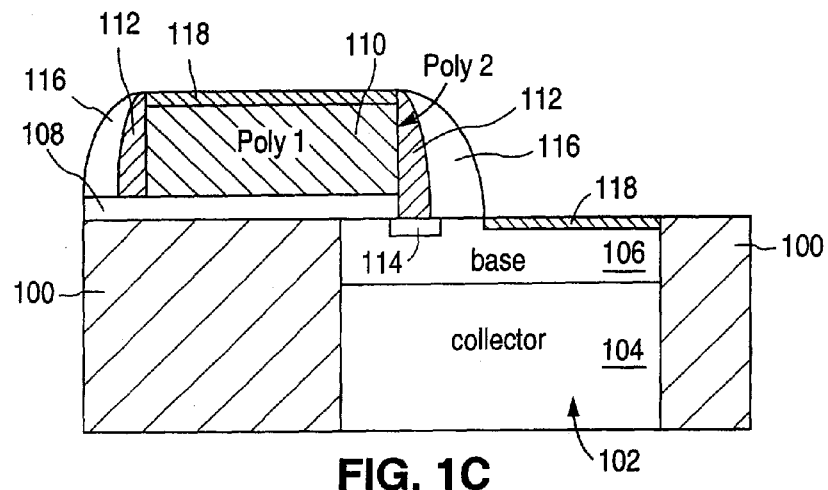
Figure 2A:
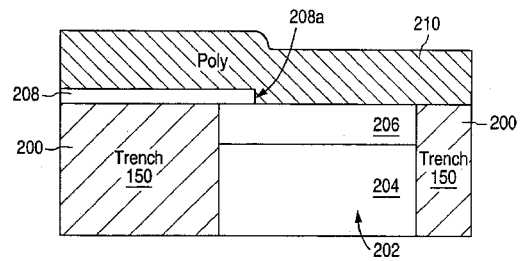
Figure 2B:
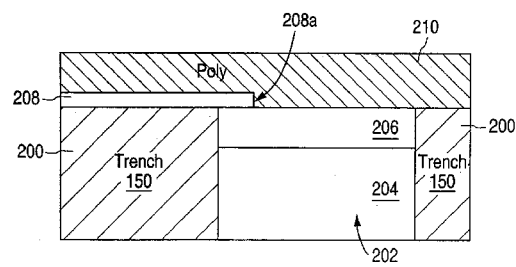
Figure 2C:
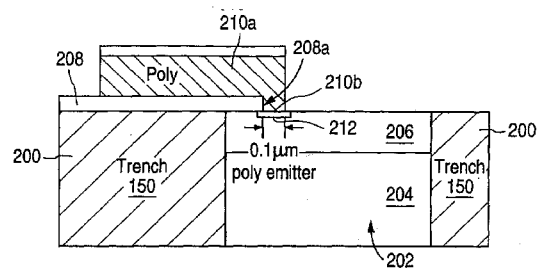
Figure 2D:
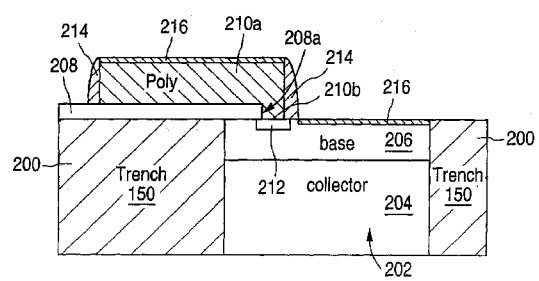

Next, a layer of dielectric material, preferably silicon dioxide, is then formed over the foregoing structure and anisotropically etched to define dielectric sidewall spacers 214 on sidewalls of the polysilicon emitter region 210a, as shown in FIG. 2D.

Following sidewall oxide spacer formation, the rest of the fabrication process continues in the conventional manner with contact implants and anneal, and formation of salicide 216 on the emitter 210a and base regions 206, resulting in the structure shown in FIG. 2D.

Thus, in accordance with the present invention a sub-lithography emitter dimension can be patterned conventionally using a masking step in such a way to form an emitter width that is smaller than the capability of the lithographic technique itself. The conventional masking and patterning of the emitter polysilicon results in a reproducible vertical polysilicon emitter sidewall; as discussed above, this is important in order to minimize the variability of the emitter width. The formation of a vertical polysilicon emitter sidewall results in a full height and width sidewall oxide spacer which, in turn, significantly reduces the possibility of shorts between the emitter polysilicon and the base areas during salicidation. The present technique also saves one polysilicon layer, but requires a chemical mechanical polishing step to level out the emitter poly surface and a masking step to pattern the emitter poly. However, these additional steps are conventional processing steps.

It should be understood that various alternatives to the embodiments of the invention described above may be employed in practicing the invention. For example, although the invention is described above with respect to npn transistors, the method applies equally well to pnp transistors. In addition, the above-described inventive techniques can be incorporated into a BiCMOS process. Thus, it is intended that the following claims define the scope of the invention and that structures and methods within the scope of these claims and their equivalents be covered thereby.

What is claimed is:

1. A method of fabricating a small bipolar transmitter emitter in an integrated circuit structure, wherein the integrated circuit includes a trench isolation structure formed in a semiconductor substrate to define a substrate active device region, a collector region having a first conductivity type formed in the substrate active device region beneath a surface thereof, a base region having a second conductivity type that is opposite the first conductivity type formed in the substrate active device region above the collector region and extending to the surface of the substrate active device region such that the surface of the active device region forms a surface of the base region, and a layer of dielectric material formed to extend partially over the surface of the base region to define an edge of the layer of dielectric material that is formed over the surface of the base region, the method comprising:

forming a layer of doped polysilicon over a surface of a layer of dielectric material and extending over the edge of the layer of dielectric material and over the surface of the base region;

performing a chemical mechanical polishing step to planarize the layer of doped polysilicon;

patterning the layer of doped polysilicon to define a polysilicon emitter region that extends over the edge of the layer of dielectric material to provide a polysilicon emitter contact on the surface of the base region;

heating the polysilicon emitter region such that dopant contained in the polysilicon emitter region diffuses from the polysilicon emitter contact through the surface of the base region to define an emitter junction region at the surface of the base region beneath the polysilicon emitter contact; and forming dielectric sidewalls spacers on sidewalls of the polysilicon emitter region.

\* \* \* \* \*

UNITED STATES PATENT AND TRADEMARK OFFICE
CERTIFICATE OF CORRECTION

PATENT NO.   : 6,399,455 B1
DATED        : Abdalla Aly Naem
INVENTOR(S)  : June 4, 2002

It is certified that error appears in the above-identified patent and that said Letters Patent is hereby corrected as shown below:

<u>Title page,</u>
The Title page should be deleted and substitute therefore the attached Title page.

<u>Drawings,</u>
Delete Drawing sheets 1-2 consisting of Figs. 1A, 1B, 1C, 2A, 2B, 2C and 2D and substitute therefore the Drawing sheets consisting of Figs. 1A, 1B, 1C, 2A, 2B, 2C, and 2D as shown on the attached pages.

Signed and Sealed this

Seventh Day of January, 2003

JAMES E. ROGAN
*Director of the United States Patent and Trademark Office*

(12) United States Patent
Naem

(10) Patent No.: US 6,399,455 B1
(45) Date of Patent: Jun. 4, 2002

(54) METHOD OF FABRICATING A BIPOLAR TRANSISTOR WITH ULTRA SMALL POLYSILICON EMITTER

(75) Inventor: Abdalla Aly Naem, Overijse (BE)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/881,904

(22) Filed: Jun. 15, 2001

(51) Int. Cl.$^7$ ............................................. H01L 21/331
(52) U.S. Cl. ......................................................... 438/369
(58) Field of Search ......................... 438/369, FOR 165

(56) References Cited

U.S. PATENT DOCUMENTS

| | | | | |
|---|---|---|---|---|
| 5,061,644 A | * | 10/1991 | Yue et al. | 148/DIG. 124 |
| 5,086,016 A | * | 2/1992 | Brodsky et al. | 148/DIG. 34 |
| 6,001,701 A | * | 12/1999 | Carroll et al. | 148/DIG. 10 |
| 6,124,180 A | * | 9/2000 | Chambers et al. | 148/DIG. 10 |

OTHER PUBLICATIONS

Wim van der Wel, et al. "Poly–Ridge Emitter Transistor (PRET): Simple Low–Power Option to a Bipolar Process", IEDM 93–453, IEEE 1993.

* cited by examiner

*Primary Examiner*—George Fourson
(74) *Attorney, Agent, or Firm*—Stallman & Pollack LLP

(57) ABSTRACT

A method of fabricating a small bipolar transistor emitter in an integrated circuit structure is provided. The integrated circuit structure includes a trench isolation structure formed in a semiconductor substrate to define a substrate active device region. A collector region having a first conductivity type is formed in the substrate active device region beneath a surface thereof. A base region having a second conductivity type opposite the first conductivity type is formed in the substrate active device region above the collector region and extending to the surface of the substrate active device region such that the surface of the active device region forms a surface of the base region. A layer of dielectric material is formed to extend at least partially over the surface of the base region to define an edge of the layer of dielectric material that is formed over the surface of the base region. A layer of doped polysilicon is then formed over the surface of the layer of dielectric material and extending over the edge of the layer of dielectric material and over the surface of the base region. A chemical mechanical polishing step is then performed to planerize the layer of doped polysilicon. The layer of doped polysilicon is then patterned to define a polysilicon emitter region that extends over the edge of the layer of dielectric material to provide a polysilicon emitter contact on the surface of the base region. The polysilicon emitter region is then heated such that dopant contained in the polysilicon emitter region diffuses from the polysilicon emitter contact through the surface of the base region to define an emitter junction region at the surface of the base region beneath the polysilicon emitter contact. Dielectric sidewall spacers are then formed on the sidewalls of the polysilicon emitter region to electrically isolate the polysilicon emitter.

1 Claim, 2 Drawing Sheets

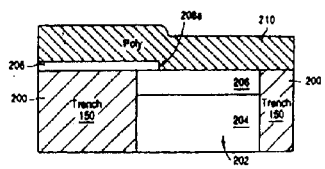

FIG. 2A

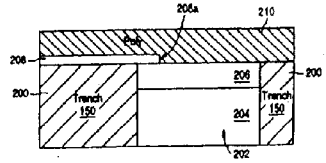

FIG. 2B

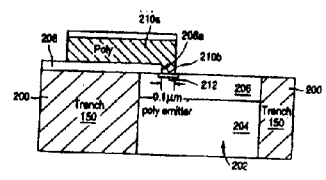

FIG. 2C